(12) United States Patent
Toyoda

(10) Patent No.: US 7,378,679 B2
(45) Date of Patent: May 27, 2008

(54) PATTERNED SUBSTRATE, ELECTRO-OPTICAL DEVICE, AND METHOD FOR MANUFACTURING AN ELECTRO-OPTICAL DEVICE

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/298,704

(22) Filed: Dec. 12, 2005

(65) Prior Publication Data

US 2006/0124937 A1 Jun. 15, 2006

(30) Foreign Application Priority Data

Dec. 15, 2004 (JP) .............................. 2004-362542

(51) Int. Cl.
*H01L 29/04* (2006.01)

(52) U.S. Cl. ............ 257/3; 257/2; 257/4; 257/E31.051; 428/840.2; 428/844; 427/475; 427/458

(58) Field of Classification Search .................... None
See application file for complete search history.

(56) References Cited

U.S. PATENT DOCUMENTS

| 7,030,556 B2 | 4/2006 | Adachi et al. |
| 2006/0008930 A1* | 1/2006 | Toyoda et al. ................. 438/22 |

FOREIGN PATENT DOCUMENTS

| JP | 2002-334782 A | 11/2002 |
| KR | 2004-0051483 A | 6/2004 |

* cited by examiner

*Primary Examiner*—A. Sefer
*Assistant Examiner*—Scott R Wilson
(74) *Attorney, Agent, or Firm*—Global IP Counselors, LLP

(57) ABSTRACT

A patterned substrate includes a laminated pattern having laminated patterns that are formed by drying droplets containing a pattern formation material. A lower layer pattern contains lyophilic microparticles that are lyophilic with respect to droplets that form an upper layer pattern.

11 Claims, 11 Drawing Sheets

PATTERNED SUBSTRATE, ELECTRO-OPTICAL DEVICE, AND METHOD FOR MANUFACTURING AN ELECTRO-OPTICAL DEVICE

BACKGROUND

1. Technical Field

The present invention relates to a patterned substrate, an electro-optical device, and a method for manufacturing an electro-optical device.

2. Related Art

Known displays equipped with light emitting elements include organic electroluminescence displays (organic EL displays) used as an electro-optical device equipped with an organic electroluminescence element (organic EL element).

Methods for manufacturing organic EL elements are generally classified by the kind of material that makes up its organic EL layer. When the material that makes up the organic EL layer is a low-molecular weight organic material, a vapor phase process is utilized, in which the organic EL layer is formed by the vapor deposition of this low-molecular weight organic material. On the other hand, when the material that makes up the organic EL layer is a high-molecular weight organic material, a liquid phase process is utilized, in which the high-molecular weight organic material is dissolved in an organic solvent or the like, and a coating of this solution is applied and dried.

With an inkjet method, which is a type of liquid phase process, tiny droplets of solution are discharged, so the location where the organic EL layer is formed, the film thickness, and the like can be controlled more precisely than with other liquid phase processes (such as spin coating). Furthermore, since an inkjet method involves discharging the droplets only in the region where the organic EL layer is to be formed (the element formation region), the high-molecular weight organic material (the raw material) can be used in a smaller amount.

With an inkjet method, however, as the contact angle of the droplets increases with respect to the element formation region (that is, as wettability decreases), the discharged droplets end up clumping in just one part of the pattern formation region. As a result, depending on the boundary between droplets and other factors, this can lead to problems such as a loss of uniformity of shape (such as the film thickness uniformity of the organic EL layer, or the film thickness uniformity between organic EL layers).

In view of this, it has been proposed in the past that the wettability of the discharged droplets be improved in an inkjet method (see JP-A-2002-334782, for example). In JP-A-2002-334782, the pattern formation region (over the transparent electrode) is subjected to a lyophilic plasma treatment (oxygen gas plasma treatment) before the droplets are discharged. This improves the wettability of the droplets and increases the uniformity of the pattern shape within the pattern formation region.

In general, an organic EL layer is formed from a laminated pattern having at least a light emitting layer that emits colored light and a hole transport layer formed between this light emitting layer and an anode (such as an ITO film). Accordingly, the lower layer pattern (such as the hole transport layer) has to be subjected to the above-mentioned oxygen plasma treatment or another such surface treatment in order to ensure the wettability of the droplets that form the upper layer pattern (light emitting layer).

However, when the lower layer pattern is subjected to an oxygen plasma treatment or the like, this lower layer pattern is oxidized, which is a problem in that the electrical characteristics of the pattern are adversely affected. Another problem is that tacking on this plasma treatment step results in correspondingly lower productivity of the organic EL display.

SUMMARY

It is an advantage of the invention to provide a patterned substrate, an electro-optical device, and a method for manufacturing an electro-optical device, with which the uniformity of a laminated pattern formed by drying droplets is increased, and the productivity thereof is improved.

The patterned substrate according to an aspect of the invention includes a laminated pattern having laminated patterns that are formed by drying droplets containing a pattern formation material, wherein the lower layer pattern contains lyophilic microparticles that are lyophilic with respect to the droplets that form the upper layer pattern.

With the patterned substrate of this aspect of the invention, the lyophilic microparticles contained in the lower layer pattern increase the wettability of the droplets forming the upper layer pattern with respect to the lower layer pattern. Therefore, an upper layer pattern of more uniform shape can be laminated over the lower layer pattern without having to add any surface treatment step or the like. This in turn allows the productivity of the patterned substrate to be increased.

It is preferable that the lyophilic microparticles contain at least one of silica ($SiO_2$) particles, titanium oxide ($TiO_2$) particles, zinc oxide (ZnO) particles, tin oxide ($SnO_2$) particles, strontium titanate ($SrTiO_3$) particles, tungsten oxide ($WO_3$) particles, bismuth oxide ($Bi_2O$) particles, niobium oxide (NbO or $Nb_2O_5$) particles, vanadium oxide ($VO_2$, $V_2O_3$, or $V_2O_5$) particles, and iron oxide ($Fe_2O_3$) particles. Alternatively, they may contain particles each composed of a combination of at least one of silica ($SiO_2$), titanium oxide ($TiO_2$), zinc oxide (ZnO), tin oxide ($SnO_2$), strontium titanate ($SrTiO_3$), tungsten oxide ($WO_3$), bismuth oxide ($Bi_2O$), niobium oxide (NbO or $Nb_2O_5$), vanadium oxide ($VO_2$, $V_2O_3$, or $V_2O_5$), and iron oxide ($Fe_2O_3$).

With this patterned substrate, because the lower layer pattern contains particles of at least one of silica ($SiO_2$), titanium oxide ($TiO_2$), zinc oxide (ZnO), tin oxide ($SnO_2$), strontium titanate ($SrTiO_3$), tungsten oxide ($WO_3$), bismuth oxide ($Bi_2O$), niobium oxide (NbO or $Nb_2O_5$), vanadium oxide ($VO_2$, $V_2O_3$, or $V_2O_5$), and iron oxide ($Fe_2O_3$), or particles of a combination of one or more of these, the upper layer pattern can be laminated in a correspondingly more uniform shape, and the productivity of the patterned substrate can be increased.

It is preferable that the lyophilic microparticles have an average diameter of 0.5 µm or less.

With this patterned substrate, because the lyophilic microparticles are formed in an average diameter of 0.5 µm or less, the upper layer pattern can be laminated in a correspondingly more uniform shape, and the productivity of the patterned substrate can be increased.

It is preferable that the pattern formation material be a light emitting element formation material, and the laminated pattern be a light emitting element.

With this patterned substrate, the light emitting element can be formed in a more uniform shape, and the productivity of a patterned substrate equipped with this light emitting element can be increased.

The electro-optical device according to another aspect of the invention includes an electrode, and a light emitting element having thin film layers that are laminated over the electrode and formed by drying droplets containing a thin film layer formation material. The lower thin film layer contains lyophilic microparticles that are lyophilic with respect to the droplets that form the upper thin film layer.

With the electro-optical device of this aspect of the invention, the lyophilic microparticles contained in the lower thin film layer increase the wettability of the droplets that form the upper thin film layer with respect to the lower thin film layer. Therefore, the upper thin film layer having a more uniform shape can be laminated over the lower thin film layer without having to add any surface treatment step. This in turn allows the productivity of the electro-optical device to be increased.

In this electro-optical device, it is preferable that the lyophilic microparticles contain at least one of silica ($SiO_2$) particles, titanium oxide ($TiO_2$) particles, zinc oxide (ZnO) particles, tin oxide ($SnO_2$) particles, strontium titanate ($SrTiO_3$) particles, tungsten oxide ($WO_3$) particles, bismuth oxide ($Bi_2O$) particles, niobium oxide (NbO or $Nb_2O_5$) particles, vanadium oxide ($VO_2$, $V_2O_3$, or $V_2O_5$) particles, and iron oxide ($Fe_2O_3$) particles. Alternatively, they contain particles each composed of a combination of at least one of silica ($SiO_2$), titanium oxide ($TiO_2$), zinc oxide (ZnO), tin oxide ($SnO_2$), strontium titanate ($SrTiO_3$), tungsten oxide ($WO_3$), bismuth oxide ($Bi_2O$), niobium oxide (NbO or $Nb_2O_5$), vanadium oxide ($VO_2$, $V_2O_3$, or $V_2O_5$), and iron oxide ($Fe_2O_3$).

With this electro-optical device, because the lower thin film layer contains particles of at least one of silica ($SiO_2$), titanium oxide ($TiO_2$), zinc oxide (ZnO), tin oxide ($SnO_2$), strontium titanate ($SrTiO_3$), tungsten oxide ($WO_3$), bismuth oxide ($Bi_2O$), niobium oxide (NbO or $Nb_2O_5$), vanadium oxide ($VO_2$, $V_2O_3$, or $V_2O_5$), and iron oxide ($Fe_2O_3$), or particles of a combination of one or more of these, the upper thin film layer can be laminated in a correspondingly more uniform shape, and the productivity of the electro-optical device can be increased.

In this electro-optical device, it is preferable that the lyophilic microparticles have an average size of 0.5 µm or less.

With this electro-optical device, because the lyophilic microparticles are formed in an average diameter of 0.5 µm or less, the upper thin film layer can be laminated in a correspondingly more uniform shape, and the productivity of the patterned substrate can be increased.

In this electro-optical device, it is preferable that the light emitting element be an electroluminescence element having the laminated thin film layers between a transparent electrode and a back electrode.

With this electro-optical device, the productivity of an electro-optical device equipped with an electroluminescence element can be increased.

In this electro-optical device, it is preferable that he light emitting element be an organic electroluminescence element having the thin film layers composed of an organic material.

With this electro-optical device, the productivity of an electro-optical device equipped with an organic electroluminescence element can be increased.

In the method for manufacturing an electro-optical device according to still another aspect of the invention, thin film layers are formed by drying droplets containing a thin film layer formation material, and these thin film layers are laminated to form a light emitting element. The method includes mixing lyophilic microparticles that are lyophilic with respect to droplets that form an upper thin film layer into droplets that form a lower thin film layer, and drying the droplets in which these lyophilic microparticles have been mixed to form the lower thin film layer, and then drying the droplets that form the upper thin film layer on the lower thin film layer to laminate the upper thin film layer over the lower thin film layer.

With the method for manufacturing an electro-optical device of this aspect of the invention, the lyophilic microparticles mixed into the droplets that form the lower thin film layer increase the wettability of the droplets that form the upper thin film layer with respect to the lower thin film layer. Therefore, an upper thin film layer having a more uniform shape can be laminated over the lower thin film layer without having to add any surface treatment step. This in turn allows the productivity of the electro-optical device to be increased.

In this method for manufacturing an electro-optical device, it is preferable that the lyophilic microparticles contain at least one of silica ($SiO_2$) particles, titanium oxide ($TiO_2$) particles, zinc oxide (ZnO) particles, tin oxide ($SnO_2$) particles, strontium titanate ($SrTiO_3$) particles, tungsten oxide ($WO_3$) particles, bismuth oxide ($Bi_2O$) particles, niobium oxide (NbO or $Nb_2O_5$) particles, vanadium oxide ($VO_2$, $V_2O_3$, or $V_2O_5$) particles, and iron oxide ($Fe_2O_3$) particles. Alternatively, they contain particles each composed of a combination at least one of silica ($SiO_2$), titanium oxide ($TiO_2$), zinc oxide (ZnO), tin oxide ($SnO_2$), strontium titanate ($SrTiO_3$), tungsten oxide ($WO_3$), bismuth oxide ($Bi_2O$), niobium oxide (NbO or $Nb_2O_5$), vanadium oxide ($VO_2$, $V_2O_3$, or $V_2O_5$), and iron oxide ($Fe_2O_3$).

With this method for manufacturing an electro-optical device, because the lower thin film layer contains particles composed of at least one of silica ($SiO_2$), titanium oxide ($TiO_2$), zinc oxide (ZnO), tin oxide ($SnO_2$), strontium titanate ($SrTiO_3$), tungsten oxide ($WO_3$), bismuth oxide ($Bi_2O$), niobium oxide (NbO or $Nb_2O_5$), vanadium oxide ($VO_2$, $V_2O_3$, or $V_2O_5$), and iron oxide ($Fe_2O_3$), or particles of a combination of one or more of these, the upper thin film layer can be laminated in a correspondingly more uniform shape, and the productivity of the electro-optical device can be increased.

In this method for manufacturing an electro-optical device, it is preferable that the lyophilic microparticles have an average diameter of 0.5 µm or less.

With this method for manufacturing an electro-optical device, because the lyophilic microparticles are formed in an average diameter of 0.5 µm or less, the upper thin film layer can be laminated in a correspondingly more uniform shape, and the productivity of the electro-optical device can be increased.

This method for manufacturing an electro-optical device preferably further includes irradiating with light the droplets that form the lower thin film layer to bring out the lyophilic property of the microparticles.

With this method for manufacturing an electro-optical device, because the lyophilic property of the lyophilic microparticles is brought out by irradiating the droplets that form the lower thin film layer with light, the material of these lyophilic microparticles can be selected from a wider range of materials.

In this method for manufacturing an electro-optical device, it is preferable that the wavelength of the light that irradiates the droplets that form the lower thin film layer be 400 nm or less.

With this method for manufacturing an electro-optical device, because the lyophilic property of the lyophilic microparticles is brought out by irradiation with light of 400 nm or less, the upper thin film layer can be laminated in a correspondingly more uniform shape, and the productivity of the electro-optical device can be increased.

In this method for manufacturing an electro-optical device, it is preferable that the light emitting element be an electroluminescence element having the laminated thin film layers between a transparent electrode and a back electrode.

With this method for manufacturing an electro-optical device, the productivity of an electro-optical device equipped with an electroluminescence element can be increased.

In this method for manufacturing an electro-optical device, it is preferable that the light emitting element be an electroluminescence element having the thin film layers composed of an organic material.

With this method for manufacturing an electro-optical device, the productivity of an electro-optical device equipped with an organic electroluminescence element can be increased.

In this method for manufacturing an electro-optical device, it is preferable that the droplets be discharged from a droplet discharge apparatus.

With this method for manufacturing an electro-optical device, because fine droplets are formed by a droplet discharge apparatus, a light emitting element of more uniform shape can be formed, and the productivity of an electro-optical device can be increased.

DESCRIPTION OF EXEMPLARY EMBODIMENTS

Figure 1:
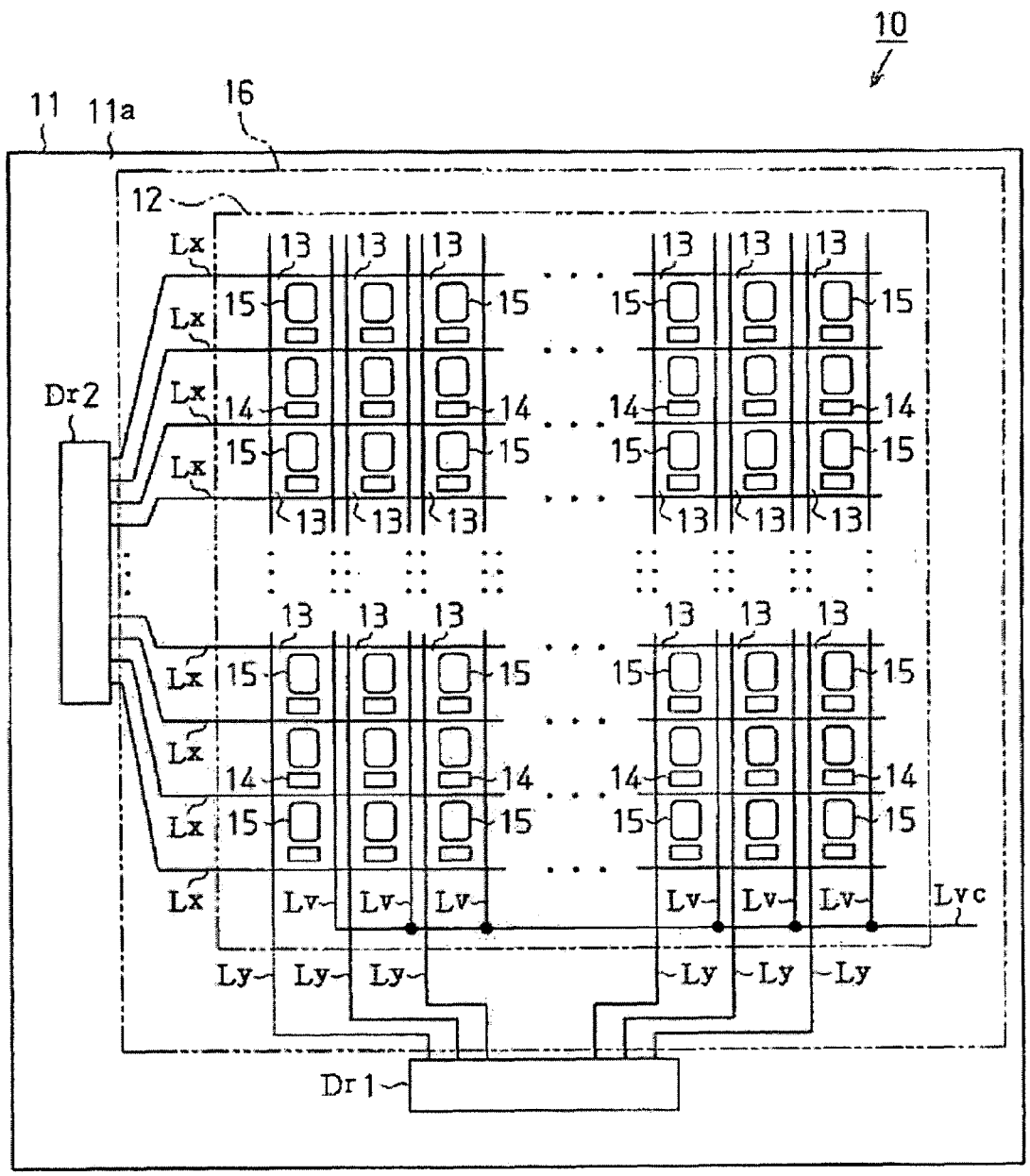
FIG. 1 is a simplified plan view of an organic EL display that is an embodiment of the invention.

Specific embodiments of the invention will now be described through reference to FIGS. 1 to 11. FIG. 1 is a simplified plan view of an organic electroluminescence display (organic EL display) that serves as an electro-optical device.

As shown in FIG. 1, an organic EL display 10 is equipped with a transparent substrate 11 as a patterned substrate. The transparent substrate 11 is a non-alkaline glass substrate formed in the shape of a square, and a square element formation region 12 is formed on the surface thereof (element formation side 11a). In this element formation region 12, a plurality of data lines Ly are formed at a specific spacing and extending in the vertical direction (column direction). The data lines Ly are electrically connected to a data line drive circuit Dr1 disposed on the lower side of the transparent substrate 11. The data line drive circuit Dr1 produces a data signal on the basis of display data supplied from an external apparatus (not shown), and outputs this data signal at a specific timing to the data lines Ly corresponding to the data signal.

In the element formation region 12, a plurality of power lines Lv extending in the column direction are provided to the data lines Ly at a specific spacing. The power lines Lv are electrically connected to a common power line Lvc formed on the lower side of the element formation region 12, and drive power produced by a power supply voltage production circuit (not shown) is supplied to the power lines Lv.

A plurality of scanning lines Lx extending in the direction perpendicular to the data lines Ly and the power lines Lv (the row direction) are formed at a specific spacing in the element formation region 12. The scanning lines Lx are electrically connected to a scanning line drive circuit Dr2 formed on the left side of the transparent substrate 11. The scanning line drive circuit Dr2 selectively drives specific scanning lines Lx from among the plurality of scanning lines Lx at a specific timing on the basis of a scanning control signal supplied from a control circuit (not shown), and a scanning signal is outputted to the scanning lines Lx.

A plurality of pixels 13 arranged in a matrix are formed by connecting to the corresponding data lines Ly, power lines Lv, and scanning lines Lx where the data lines Ly and the scanning lines Lx intersect. A control element formation region 14 and a light emitting element formation region 15 are delineated within each of the pixels 13. The pixels 13 are protected by covering the top side of the element formation region 12 with a square sealing substrate 16 (the two-dot chain line in FIG. 1).

The pixels 13 in this embodiment are pixels that emit light of corresponding colors, and are either red pixels that emit red light, or green pixels that emit green light, or blue pixels that emit blue light. These pixels 13 are used to display a full-color image on the back side (display side 11b) of the transparent substrate 11.

Figure 2:
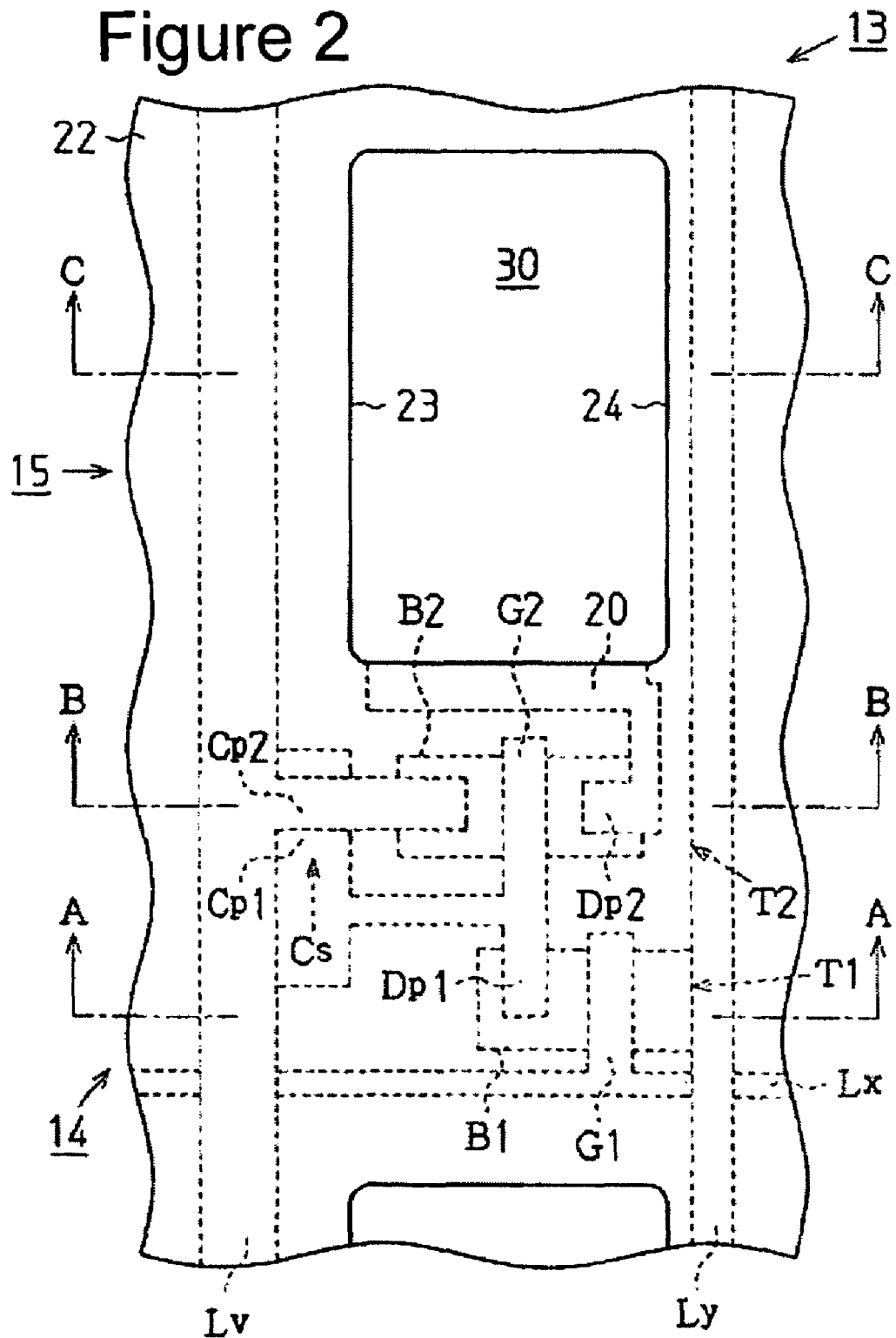
FIG. 2 is a simplified plan view of pixels in the same.
Figure 3:
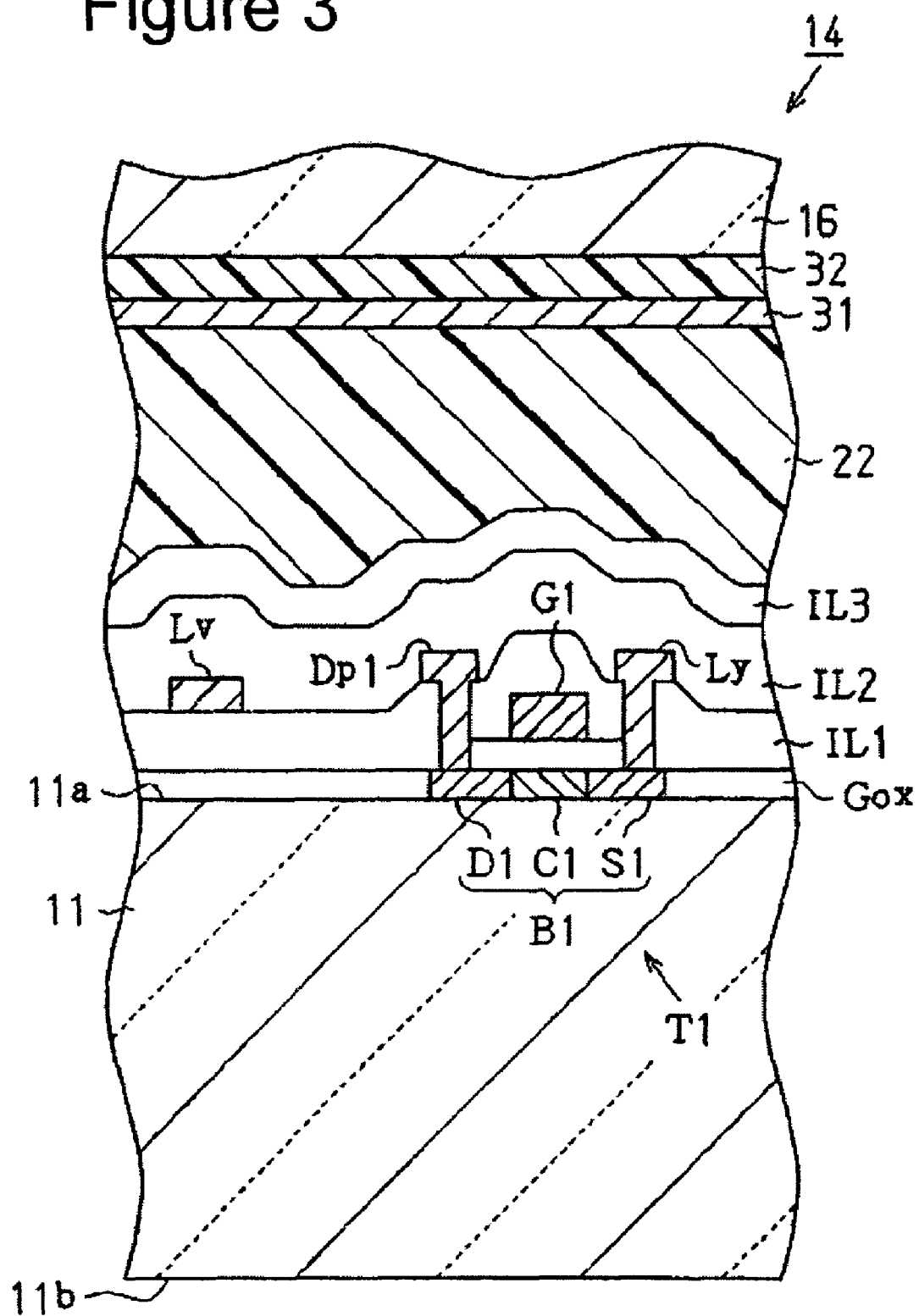
FIG. 3 is a simplified cross section of the control element formation region in the same.
Figure 4:
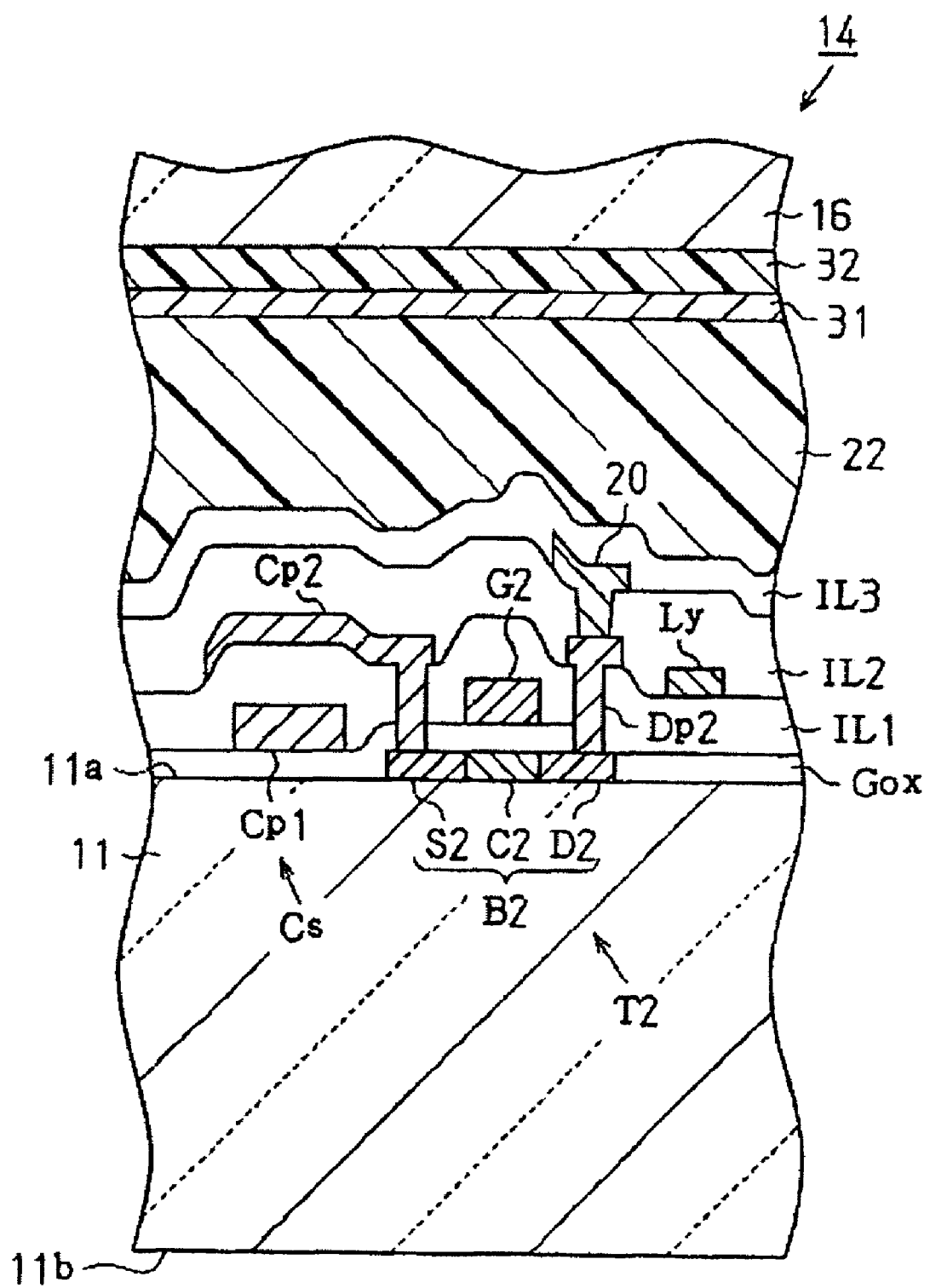
FIG. 4 is a simplified cross section of the control element formation region in the same.
Figure 5:
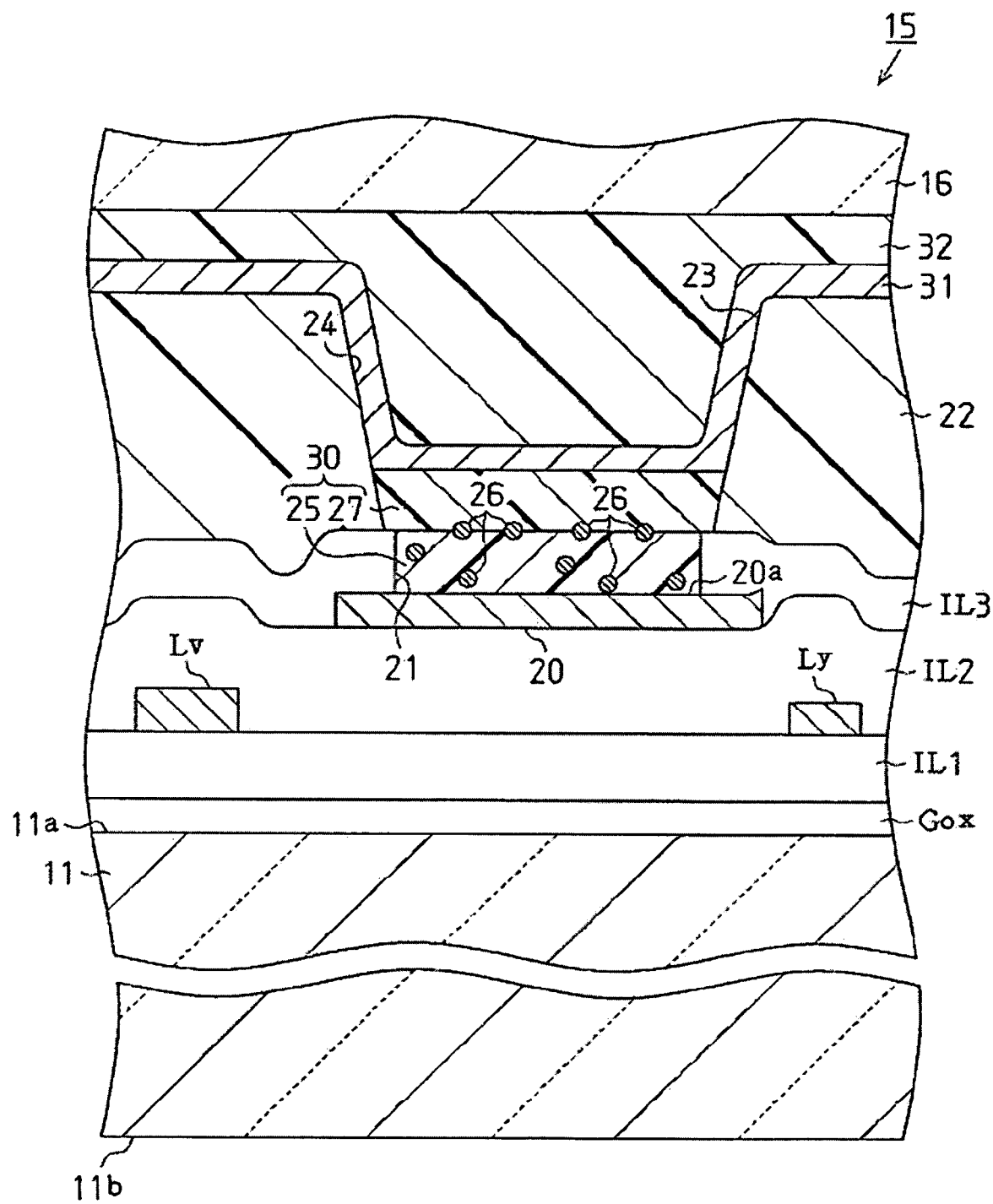
FIG. 5 is a simplified cross section of the light emitting element formation region in the same.

The pixels 13 will now be described. FIG. 2 is a simplified plan view of the layout of the control element formation region 14 and the light emitting element formation region 15. FIGS. 3 and 4 are simplified cross sections of the control element formation region 14 along the one-dot chain lines A-A and B-B, respectively, in FIG. 2. FIG. 5 is a simplified cross section of the light emitting element formation region 15 along the one-dot chain line C-C in FIG. 2.

First the structure of the control element formation regions 14 will be described. As shown in FIG. 2, a control element formation region 14 is formed on the lower side of each of the pixels 13, and a first transistor (switching transistor) T1, a second transistor (drive transistor) T2, and a holding capacitor Cs are formed in each control element formation region 14.

As shown in FIG. 3, the switching transistor T1 is equipped with a first channel film B1 at its lowermost layer. The first channel film B1 is a p-type polysilicon film formed in the shape of an island on the element formation side 11a, in the middle of which is formed a first channel region C1. Activated n-type regions (a first source region S1 and a first drain region D1) are formed flanking the first channel region C1 on the left and right sides. In other words, the switching transistor T1 is what is known as a polysilicon TFT.

A gate insulation film Gox and a first gate electrode G1 are formed on the upper side of the first channel region C1, in that order from the element formation side 11a. The gate insulation film Gox is a silicon oxide film or other such insulating film having optical transmissivity, and is deposited over substantially the entire surface of the element formation side 11a and the upper side of the first channel region C1. The first gate electrode G1 is a tantalum, aluminum, or other such low-resistance metal film, formed across from the first channel region C1, and is electrically connected to a scanning line Lx as shown in FIG. 2. As shown in FIG. 3, the first gate electrode G1 is electrically insulated by a first interlayer insulation film IL1 deposited on the upper side of the gate insulation film Gox.

When the scanning line drive circuit Dr2 inputs a scanning signal through the scanning line Lx to the first gate electrode G1, the switching transistor T1 is switched on by this scanning signal.

A data line Ly that goes through the first interlayer insulation film IL1 and the gate insulation film Gox is electrically connected to the first source region S1. A first drain electrode Dp1 that goes through the first interlayer insulation film IL1 and the gate insulation film Gox is electrically connected to the first drain region D1. As shown in FIG. 3, this data line Ly and first drain electrode Dp1 are electrically connected by a second interlayer insulation film IL2 deposited on the upper side of the first interlayer insulation film IL1.

The scanning line drive circuit Dr2 then successively selects the scanning lines Lx one at a time on the basis of line-order scanning, whereupon the switching transistor T1 of the pixel 13 is switched on in its turn and while selected. When the switching transistor T1 is switched on, the data signal outputted from the data line drive circuit Dr1 is outputted through the data line Ly and the switching transistor T1 (channel film B1) to the first drain electrode Dp1.

As shown in FIG. 4, the drive transistor T2 is a polysilicon TFT equipped with a second channel region C2, a second source region S2, and a second drain region D2. A second gate electrode G2 is formed via the gate insulation film Gox on the upper side of a second channel film B2 thereof. The second gate electrode G2 is a tantalum, aluminum, or other such low-resistance metal film, and as shown in FIG. 2, is electrically connected to a lower electrode Cp1 of the holding capacitor Cs and the first drain electrode Dp1 of the switching transistor T1. As shown in FIG. 4, the second gate electrode G2 and the lower electrode Cp1 are electrically connected by the first interlayer insulation film IL1 deposited on the upper side of the gate insulation film Gox.

The second source region S2 is electrically connected to an upper electrode Cp2 of the holding capacitor Cs that goes through the first interlayer insulation film IL1. As shown in FIG. 2, this upper electrode Cp2 is electrically connected to the corresponding power line Lv. In other words, as shown in FIGS. 2 and 4, the holding capacitor Cs, in which the first interlayer insulation film IL1 serves as a capacitance film, is connected between the second source region S2 and the second gate electrode G2 of the drive transistor T2. The second drain region D2 is electrically connected to a second drain electrode Dp2 that goes through the first interlayer insulation film IL1. The second drain electrode Dp2 and the upper electrode Cp2 are electrically connected by the second interlayer insulation film IL2 deposited on the upper side of the first interlayer insulation film IL1.

When the data signal outputted from the data line drive circuit Dr1 is outputted through the switching transistor T1 to the first drain region D1, the holding capacitor Cs stores a charge relative to the outputted data signal. Then, when the switching transistor T1 is switched off, a drive current relative to the charge stored in the holding capacitor Cs is outputted through the drive transistor T2 (channel film B2) to the second drain region D2.

Next, the structure of the light emitting element formation regions 15 will be described.

As shown in FIG. 2, a square light emitting element formation region 15 is formed on the upper side of each of the pixels 13. As shown in FIG. 5, an anode 20 is formed as a transparent electrode on the upper side of the second interlayer insulation film IL2 in the light emitting element formation region 15.

The anode 20 is a transparent conductive film having optical transmissivity, such as an ITO film, one end of which goes through the second interlayer insulation film IL2 and is electrically connected to the second drain region D2, as shown in FIG. 4. The top side 20a of this anode 20 is made lyophilic to lower layer droplets 25D (see FIG. 9) by a lyophilic treatment (discussed below; step 12 in FIG. 6).

A third interlayer insulation film IL3, such as a silicon oxide film that insulates the anode 20 from other anodes 20, is deposited on the upper side of the anode 20. A square through-hole 21 made in the approximate middle on the upper side of the anode 20 is formed in this third interlayer insulation film IL3, and a barrier layer 22 is formed on the upper side of this third interlayer insulation film IL3.

The barrier layer 22 is formed from what is called a positive photosensitive material, which when exposed to exposure light Lpr (see FIG. 7) of a specific wavelength, only the exposed portion becomes soluble in a developing solution such as an alkaline solution, and more specifically is formed from a resin such as a photosensitive polyimide that repels a lower layer formation solution 25L (see FIG. 9) and an upper layer formation solution 27L (see FIG. 10), which are discussed below. A receptacle hole 23 that flares out upward is formed across from the through-hole 21. The receptacle hole 23 is formed large enough that the lower layer droplet 25D (see FIG. 9) and upper layer droplet 27D (see FIG. 10), which are discussed below, can be accommodated in the corresponding light emitting element formation region 15. A barrier 24 that surrounds the light emitting element formation region 15 (the anode 20 and the through-hole 21) is formed by the inner peripheral surface of this receptacle hole 23.

A lower thin film layer (hole transport layer) 25 is formed as a lower layer pattern on the upper side of the anode 20 within the light emitting element formation region 15. The hole transport layer 25 is a pattern composed of a hole transport layer formation material 25s (see FIG. 9) that constitutes a thin film layer formation material and a pattern formation material.

The hole transport layer formation material 25s in this embodiment is, for example, a benzidine derivative, styrylamine derivative, triphenylmethane derivative, triphenylamine derivative, hydrazone derivative, or other such low-molecular weight compound, or a high-molecular weight compound whose structure partly includes one of these, or polyaniline, polythiophene, polyvinylcarbazole, α-naphthylphenyldiamine, a mixture of poly(3,4-ethylenedioxythiophene) and polystyrenesulfonic acid (PEDOT/PSS) (Baytron P, trademark of Bayer), or another such high-molecular weight compound.

Figure 9:
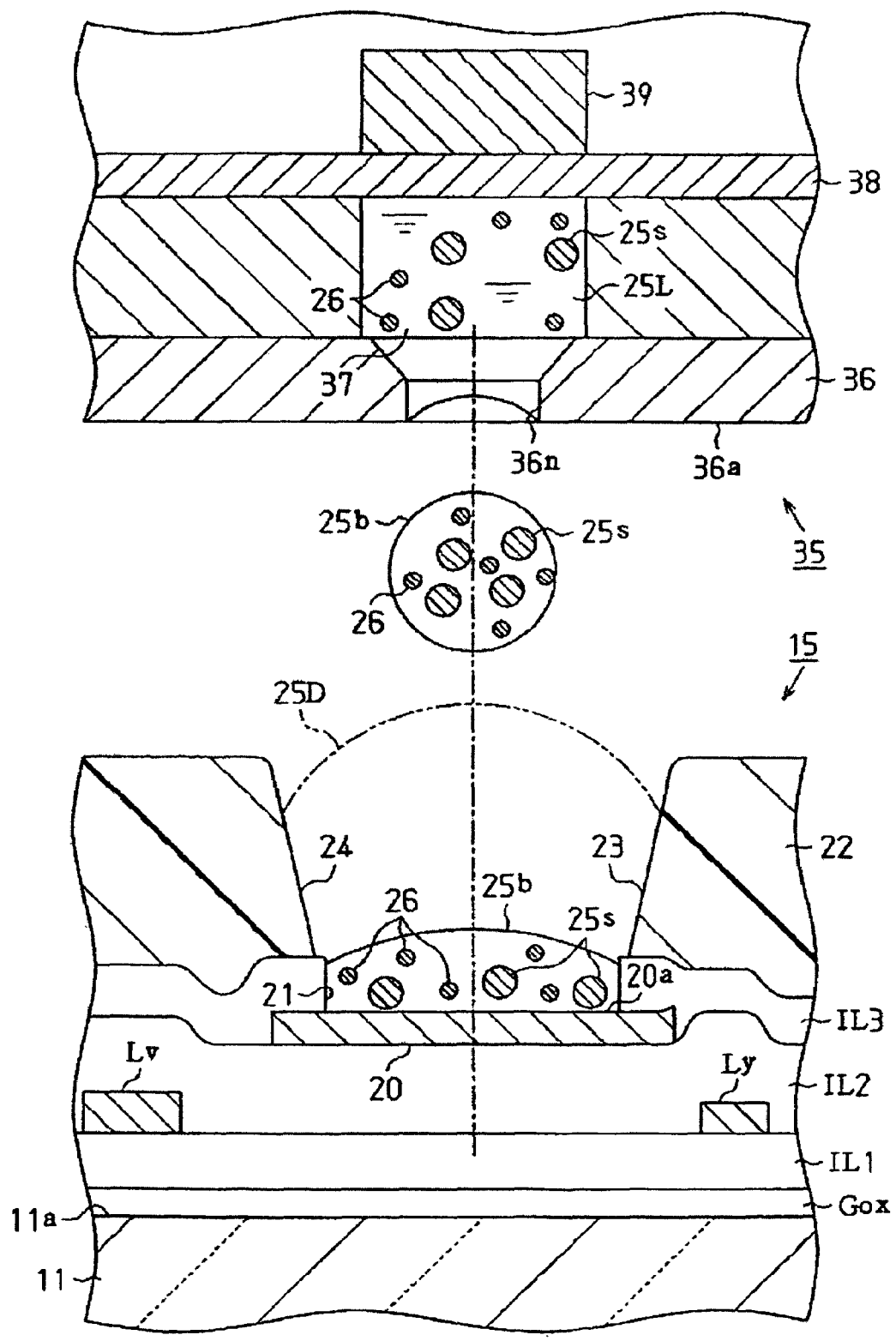
FIG. 9 is a diagram illustrating the steps of manufacturing an electro-optical device in the same.
Figure 10:
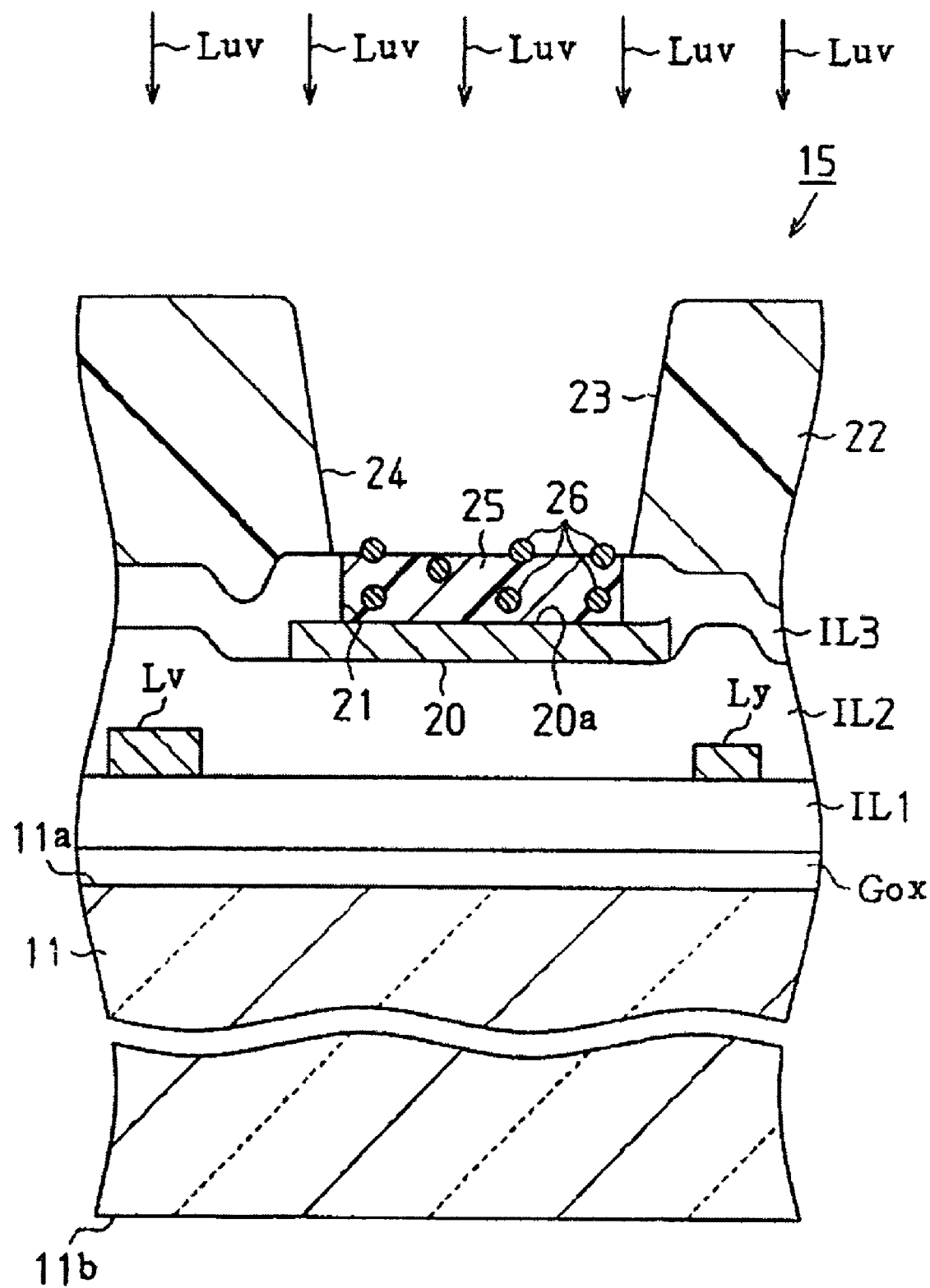
FIG. 10 is a diagram illustrating the steps of manufacturing an electro-optical device in the same.

This hole transport layer 25 contains lyophilic microparticles 26 (see FIGS. 9 and 10). The lyophilic microparticles 26 are composed of titanium oxide ($TiO_2$) or another substance that is lyophilic with respect to the upper layer droplets 27D discussed below, and are formed in an average size of 0.5 μm or less.

An upper thin film layer (light emitting layer) 27 is laminated as an upper layer pattern on the upper side of the hole transport layer 25. The light emitting layer 27 is a pattern composed of the light emitting layer formation material 27s (see FIG. 11) that constitutes a thin film layer formation material and a pattern formation material.

The light emitting layer 27 in this embodiment is formed from a light emitting layer formation material 27s of the corresponding color (a red light emitting layer formation material that emits red light, a green light emitting layer formation material that emits green light, or a blue light emitting layer formation material that emits blue light). Examples of the red light emitting layer formation material include a high-molecular weight compound having an alkyl or alkoxy substituent on the benzene ring of a polyvinylenestyrene derivative, or a high-molecular weight compound having a cyano group on the vinylene group of a polyvinylenestyrene derivative. Examples of the green light emitting layer formation material include a polyvinylenestyrene derivative in which an alkyl, alkoxy, or allyl derivative substituent has been introduced into a benzene ring. Examples of the blue light emitting layer formation material include a polyfluorene derivative (such as a copolymer of dialkylfluorene and anthracene, or a copolymer of dialkylfluorene and thiophene).

An organic electroluminescence layer (organic EL layer) 30 is formed as a laminated pattern by the hole transport layer 25 and the light emitting layer 27.

A cathode 31 is formed as a back electrode composed of an optically reflective metal film, such as aluminum, on the upper side of the barrier layer 22 (barrier 24) and the upper side of the organic EL layer 30. The cathode 31 is formed so as to cover the entire surface of the element formation side 11a, and supplies potential for all of the light emitting element formation regions 15 shared by the pixels 13.

Specifically, an organic electroluminescence element (organic EL element) is constituted as a light emitting element by the anode 20, the organic EL layer 30, and the cathode 31.

When drive current corresponding to the data signal is supplied through the second drain region D2 to the anode 20, the organic EL layer 30 emits light at a brightness corresponding to this drive current. Here, the light emitted from the organic EL layer 30 toward the cathode 31 side (the upper side in FIG. 4) is reflected by the cathode 3 1. Accordingly, almost all of the light emitted from the organic EL layer 30 is transmitted through the anode 20, the second interlayer insulation film IL2, the first interlayer insulation film IL1, the gate insulation film Gox, the element formation side 11a, and the transparent substrate 1, and is emitted outward from the back (the display side 11b) of the transparent substrate 11. Specifically, an image based on the data signal is displayed on the display side 11b of the organic EL display 10.

An adhesive layer 32 composed of an epoxy resin or the like is formed on the upper side of the cathode 31, and a sealing substrate 16 that covers the element formation region 12 is applied via this adhesive layer 32. The sealing substrate 16 is a non-alkaline glass substrate, and serves to prevent the oxidation of the pixels 13, the wiring lines Lx, Ly, and Lv, and so forth.

Method for Manufacturing Organic EL Display 10

Figure 6:
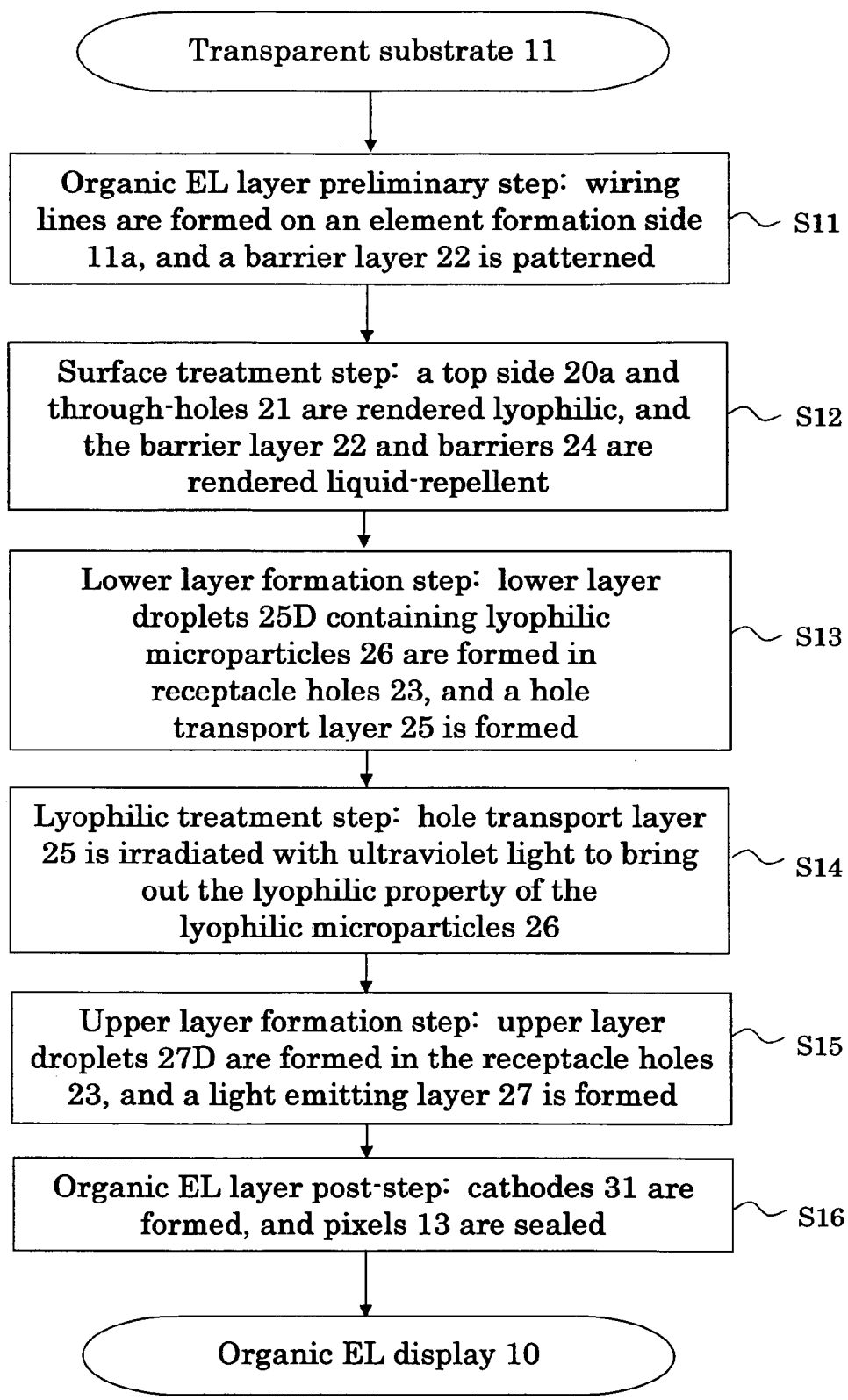
FIG. 6 is a flowchart of the steps of manufacturing an electro-optical device in the same.

Next, the method for manufacturing the organic EL display 10 will be described. FIG. 6 is a flowchart illustrating the method for manufacturing the organic EL display 10, and FIGS. 7 to 11 are diagrams illustrating this method for manufacturing the organic EL display 10.

Figure 7:
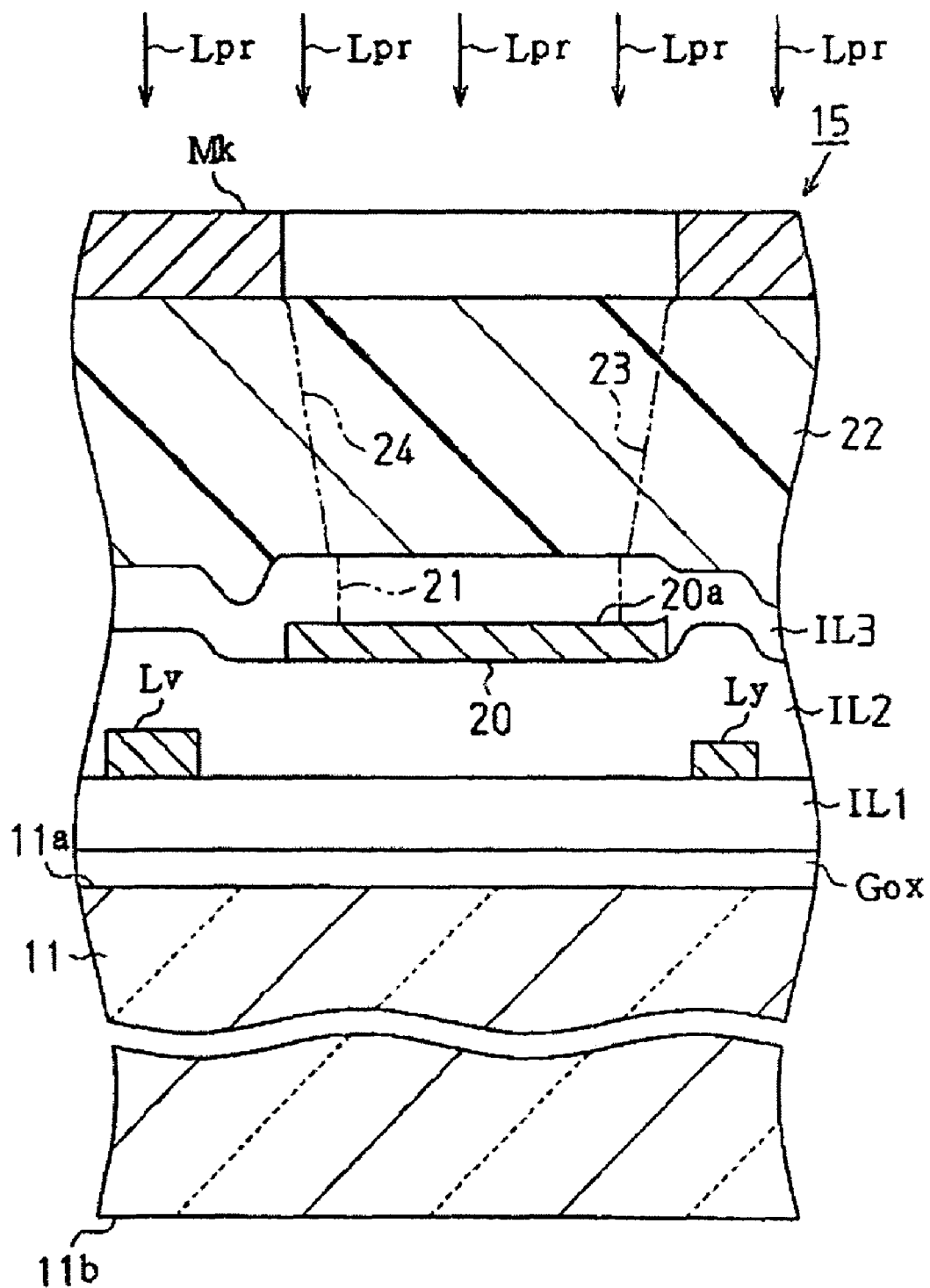
FIG. 7 is a diagram illustrating the steps of manufacturing an electro-optical device in the same.

As shown in FIG. 6, first an organic EL layer preliminary step (step S11) is performed, in which the wiring lines Lx, Ly, Lv, and Lvc and the transistors T1 and T1 are formed on the element formation side 11a of the transparent substrate 11, and the barrier layer 22 is patterned. FIG. 7 is a diagram illustrating this organic EL layer preliminary step.

Specifically, in the organic EL layer preliminary step, first a crystallized polysilicon film is formed by excimer laser or the like over the entire element formation side 11a, and this polysilicon film is patterned to form the channel films B1 and B2. Next, the gate insulation film Gox composed of a silicon oxide film or the like is formed over the entire upper surface of the element formation side 11a and the channel films B13 and B2, and a low-resistance metal film of tantalum or the like is deposited over the entire upper surface of the gate insulation film Gox. This low-resistance metal film is patterned to form the gate electrodes G1 and G2, the lower electrode Cp1 of the holding capacitor Cs, and the scanning line Lx.

When the gate electrodes G1 and G2 have been formed, an n-type impurity region is formed in each of the channel films B1 and B2 by ion doping, using the gate electrodes G1 and G2 as masks. This forms the channel regions C1 and C2, the source regions S1 and S2, and the drain regions D1 and D2. When the source regions S1 and S2 and the drain regions D1 and D2 have been formed in the channel films B1 and B2, respectively, the first interlayer insulation film IL1 composed of a silicon oxide film or the like is deposited over the entire upper surface of the gate electrodes G1 and G2, the scanning line Lx, and the gate insulation film Gox.

When the first interlayer insulation film IL1 has been formed, a pair of contact holes is patterned at positions relative to the source regions S1 and S2 and the drain regions D1 and D2 in the first interlayer insulation film IL1. Next, a metal film of aluminum or the like is deposited over the entire upper surface of the first interlayer insulation film IL1 and in these contact holes, and this metal film is patterned to form the data line Ly and the upper electrode Cp2 of the holding capacitor Cs corresponding to each of the source regions S1 and S2. At the same time, the drain electrodes Dp1 and Dp2 corresponding to the drain regions D1 and D2 are formed. The second interlayer insulation film IL2 composed of a silicon oxide film or the like is deposited over the entire upper surface of the data line Ly, the upper electrode Cp2, the drain regions D1 and D2, and the first interlayer insulation film IL1. This forms the switching transistor T1 and the drive transistor T2.

When the second interlayer insulation film IL2 has been deposited, a via hole is formed at a position across from the second drain region D2 in this second interlayer insulation film IL2. Then, a transparent conductive film having optical transmissivity, such as an ITO film, is deposited over the entire upper surface of the second interlayer insulation film IL2 and in this via hole, and this transparent conductive film is patterned to form the anode 20 that connects to the second drain region D2. When the anode 20 has been formed, the third interlayer insulation film IL3 composed of a silicon oxide film or the like is formed over the entire upper surface of the second interlayer insulation film IL2 and this anode 20.

When the third interlayer insulation film IL3 has been deposited, as shown in FIG. 7, the entire upper surface of the third interlayer insulation film IL3 is coated with a photo-sensitive polyimide resin or the like to form the barrier layer 22. Developing is then performed by exposing the barrier layer 22 at a position across from the anode 20 to exposure light Lpr of a specific wavelength through a mask Mk, which results in the patterning of the receptacle hole 23, whose inner peripheral surface is the barrier 24, in this barrier layer 22.

When the receptacle hole 23 has been patterned, the third interlayer insulation film IL3 is patterned using the barrier layer 22 as a mask, and a through-hole 21 that communicates with the receptacle hole 23 is formed on the upper side of the anode 20.

This completes the organic EL layer preliminary step in which the wiring lines Lx, Ly, Lv, and Lvc and the transistors T1 and T2 are formed on the element formation side 11a, and the receptacle hole 23 is patterned.

Figure 8:
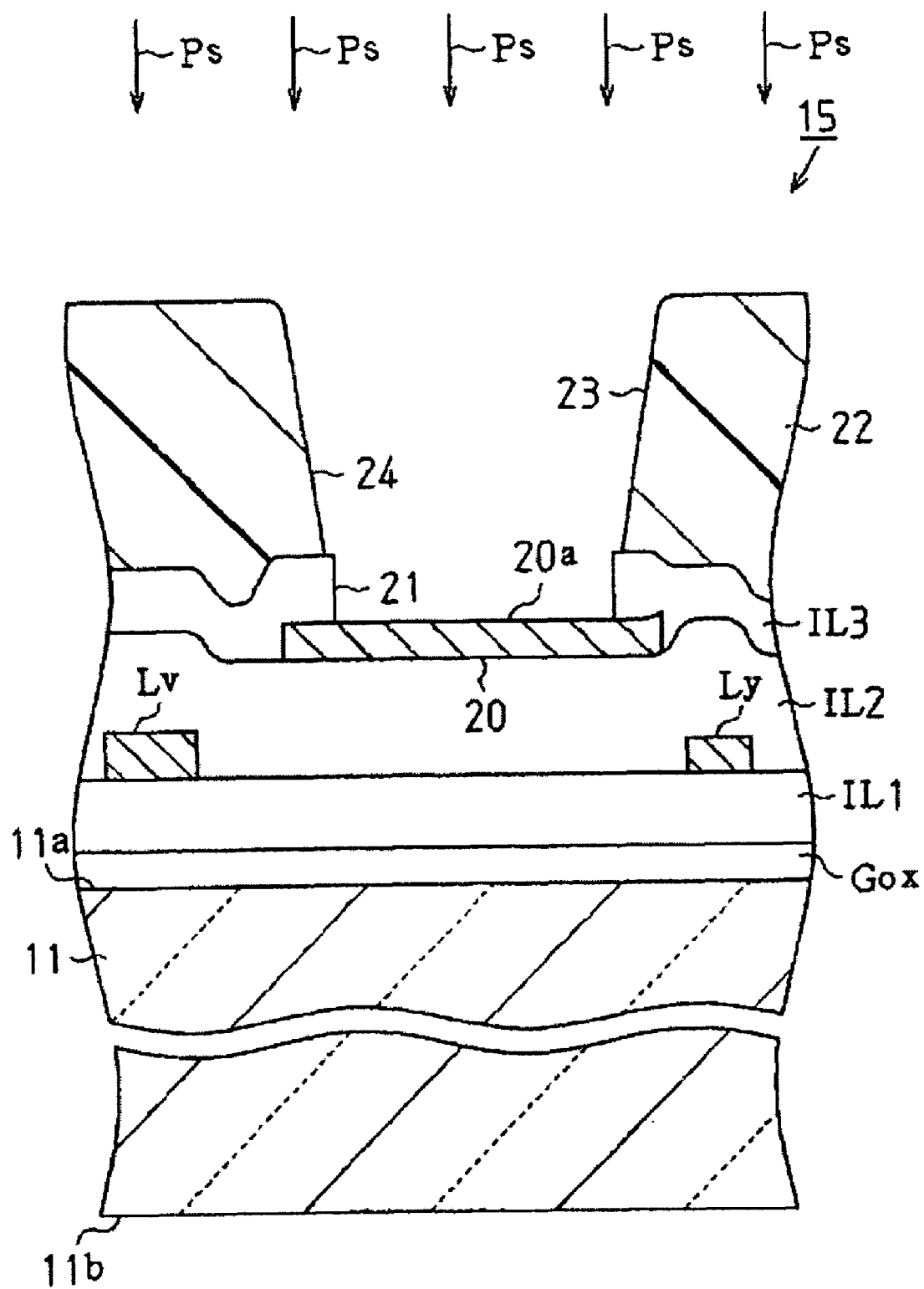
FIG. 8 is a diagram illustrating the steps of manufacturing an electro-optical device in the same.

As shown in FIG. 6, when the organic EL layer preliminary step is complete (step S11), a surface treatment step, in which the inside of the receptacle hole 23 and the surface of the barrier layer 22 are treated, is performed in order to form the lower layer droplet 25D and the upper layer droplet 27D discussed below (step S12). FIG. 8 is a diagram illustrating this surface treatment step.

Specifically, in the surface treatment step, first the entire element formation side 11a is exposed to an oxygen-based plasma Ps to perform a hydrophilic treatment in which the third interlayer insulation film IL3 (through-hole 21) and the anode 20 (top side 20a) in the receptacle hole 23 are rendered hydrophilic. When this hydrophilic treatment has been performed, the entire element formation side 11a is exposed to a fluorine-based plasma Ps to perform a liquid repellency treatment in which the barrier layer 22 (barrier 24) is once again rendered liquid repellent.

As shown in FIG. 6, when the surface treatment step is complete (step S12), a lower layer formation step (step S13) is performed, in which a lower layer droplet 25D containing the lyophilic microparticles 26 and the hole transport layer formation material 25s is formed inside the receptacle hole 23, and the hole transport layer 25 is formed. FIG. 9 is a diagram illustrating this lower layer formation step.

First, the structure of the droplet discharge apparatus used to form the lower layer droplet 25D will be described.

As shown in FIG. 9, a liquid discharge head 35 that constitutes the droplet discharge apparatus in this embodiment is equipped with a nozzle plate 36. Numerous nozzles 36n for discharging a liquid are formed facing upward on the bottom side (the nozzle formation side 36a) of this nozzle plate 36. A liquid supply chamber 37 that communicates with a liquid reservoir (not shown) and allows a liquid to be supplied to the nozzles 36n is formed on the upper side of the nozzles 36n. A diaphragm 38 that vibrates reciprocally up and down and that expands and contracts the volume inside the liquid supply chamber 37 is provided on the upper side of the liquid supply chamber 37. A piezoelectric element 39 that vibrates the diaphragm 38 by expanding and contracting vertically is provided on the upper side of each diaphragm 38 at a position across from the liquid supply chamber 37.

As shown in FIG. 9, a transparent substrate 11 conveyed to the droplet discharge apparatus is positioned with its element formation side 11a parallel to the nozzle formation side 36a and with the center of the receptacle holes 23 disposed directly under each of the nozzles 36n.

Here, a lower layer formation liquid 25L produced by dissolving or dispersing the hole transport layer formation material 25s in a lower layer liquid in which the hole transport layer formation material 25s can be dissolved or dispersed, and mixing the lyophilic microparticles 26 into this solution is supplied into the liquid supply chamber 37.

When a drive signal for forming the lower layer droplet 25D is inputted to the liquid discharge head 35, the piezoelectric element 39 expands or contracts according to this drive signal, thereby increasing or decreasing the volume of the liquid supply chamber 37. If the volume of the 37 decreases here, the lower layer formation liquid 25L is discharged as a microscopic lower layer droplet 25b from the nozzle 36n in an amount corresponding to the reduction in volume. The discharged microscopic lower layer droplet 25b lands on the top side of the anode 20 in the receptacle hole 23. When the volume of the liquid supply chamber 37 then increases, the lower layer formation liquid 25L is supplied from a liquid reservoir (not shown) into the liquid supply chamber 37 in an amount equal to the increase in volume. In other words, the liquid discharge head 35 discharges the required volume of lower layer formation liquid 25L toward the receptacle hole 23 by means of the expansion and contraction of the liquid supply chamber 37. Here, the liquid discharge head 35 discharges the microscopic lower layer droplet 25b in an amount such that the hole transport layer formation material 25s contained in the lower layer droplet 25D will form a film of the desired thickness.

The microscopic lower layer droplet 25b discharged into the receptacle hole 23 uniformly wets and spreads out over the entire top side of the anode 20 and inside the through-hole 21 in an amount corresponding to how much the above-mentioned hydrophilic treatment has been performed. After a while, the uniformly spread-out microscopic lower layer droplets 25b form the lower layer droplet 25D, which has a hemispherical surface, by means of the liquid repellency of the barrier 24 and its own surface tension, as shown by the two-dot chain line in FIG. 9.

When the lower layer droplet 25D has been formed, the transparent substrate 11 (the lower layer droplet 25D) is placed under a specific reduced pressure to evaporate the lower layer liquid of the lower layer droplet 25D and solidify the hole transport layer formation material 25s in a state in which it uniformly contains the lyophilic microparticles 26. The solidified hole transport layer formation material 25s forms the hole transport layer 25 in a uniform shape, according to the amount of uniform spreading over the entire top side of the anode 20. This forms the hole transport layer 25 containing the lyophilic microparticles 26 over the entire top side of the anode 20 in the through-hole 21 (receptacle hole 23).

As shown in FIG. 6, when the hole transport layer 25 has been formed (step S13), a lyophilic treatment is performed in which the lyophilic property of the lyophilic microparticles 26 is brought out (step S14). Specifically, as shown in FIG. 10, the hole transport layer 25 is irradiated with ultraviolet light Luv with a wavelength of 400 nm or less. The lyophilic microparticles 26 that have been irradiated with the ultraviolet light Luv manifest their lyophilic property as a result of the production of hydroxyl groups on the surface of the lyophilic microparticles 26, the formation of physically adsorbed water originating in these hydroxyl groups, and so forth.

Figure 11:
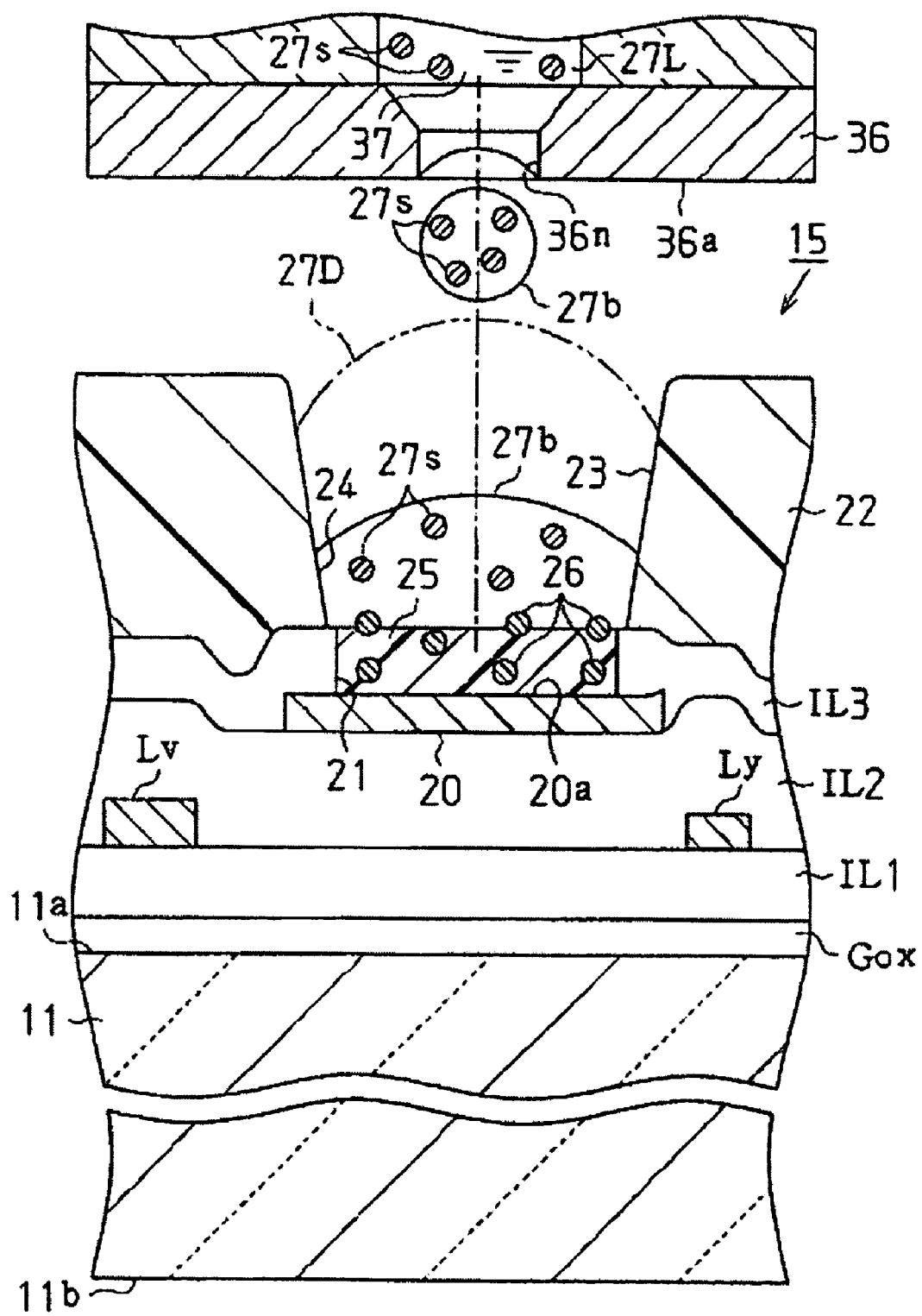
FIG. 11 is a diagram illustrating the steps of manufacturing an electro-optical device in the same.

As shown in FIG. 6, when the lyophilic property of the lyophilic microparticles 26 has been brought out (step S14), an upper layer formation step (step S15) is performed in which the upper layer droplet 27D containing a light emitting layer formation material of the corresponding color is formed in the receptacle hole 23, and the light emitting layer 27 is formed. FIG. 11 is a diagram illustrating the upper layer formation step.

In this upper layer formation step, just as in the lower layer formation step, a microscopic upper layer droplet 27b, composed of the upper layer formation liquid 27L obtained by dissolving or dispersing a light emitting layer formation material 27s of one color in an upper layer liquid, is discharged from a nozzle 36n onto the corresponding hole transport layer 25. The liquid discharge head 35 here discharges the microscopic upper layer droplet 27b in an amount corresponding to the desired film thickness in which the light emitting layer 27 is to be formed in the receptacle hole 23.

The upper layer liquid in this embodiment is a liquid capable of dissolving or dispersing the light emitting layer formation material 27s, and is a liquid that brings out affinity with the above-mentioned lyophilic microparticles 26.

Its affinity with the lyophilic microparticles 26 contained in the lower layer formation liquid 25L causes the microscopic upper layer droplet 27b discharged on the hole transport layer 25 to uniformly wet and spread out over the entire top side of the hole transport layer 25 in an extent according to the amount in which the lyophilic microparticles 26 are contained. After a while, the microscopic upper layer droplet 27b that has uniformly spread out forms the upper layer droplet 27D, which has a hemispherical surface, by means of the liquid repellency of the barrier 24 and its own surface tension, as shown by the two-dot chain line in FIG. 9.

When the upper layer droplet 27D has been formed, just as in the lower layer formation step described above, the transparent substrate 11 (upper layer droplet 27D) is placed under a specific reduced pressure to evaporate the upper layer liquid and solidify the light emitting layer formation material 27s. The solidified light emitting layer formation material 27s forms the light emitting layer 27 in a uniform shape (such as a uniform film thickness distribution within the light emitting element formation region 15 or a uniform film thickness distribution between light emitting element formation regions 15), according to the amount of uniform wetting and spreading over the entire top side of the hole transport layer 25. Specifically, this forms the organic EL layer 30 having a uniform shape.

As shown in FIG. 6, when the hole transport layer 25 (organic EL layer 30) has been formed (step S15), an organic EL layer post-step (step S16) is performed, in which the cathode 31 is formed over the light emitting layer 27 (organic EL layer 30) and the barrier layer 22, and the pixel 13 is sealed. Specifically, the cathode 31 composed of a metal film such as aluminum is deposited over the entire top side of the organic EL layer 30 and the barrier layer 22, forming an organic EL element composed of the anode 20, the organic EL layer 30, and the cathode 31. When the organic EL element has been formed, an adhesive layer 32 is formed by coating the entire top side of the cathode 31 (pixel 13) with an epoxy resin or the like, and the sealing substrate 16 is applied to the transparent substrate 11 via this adhesive layer 32.

The result of the above is that an organic EL display 10 in which the organic EL layer 30 has a uniform shape can be manufactured.

Next, the effects of this embodiment, constituted as above, will be described.

With the above embodiment, the lower layer formation liquid 25L was produced by mixing the lyophilic microparticles 26 into the lower layer liquid, and the lower layer droplet 25D composed of this lower layer formation liquid 25L was dried to form the hole transport layer 25. Therefore, the upper layer droplet 27D can wet and spread out over the entire top side of the hole transport layer 25 in an extent corresponding to the amount in which the lyophilic microparticles 26 are contained. As a result, damage to the hole transport layer 25 by a plasma or other surface treatment can be avoided, and the shape of the light emitting layer 27 can be made more uniform. This in turn allows the shape of the organic EL layer 30 to be made more uniform, and increases the productivity of the organic EL display 10.

(2) With the above embodiment, the lyophilic microparticles 26 had an average size of 0.5 μm or less. Therefore, the shape of the hole transport layer 25 can be made flatter according to how small the lyophilic microparticles 26 are made, and this in turn allows the shape of the organic EL layer 30 to be made more uniform.

(3) With the above embodiment, the hole transport layer 25 was irradiated with the ultraviolet light Luv to bring out the lyophilic property of the lyophilic microparticles 26. Therefore, just the top side of the hole transport layer 25 can be rendered lyophilic, and the surface condition (liquid repellency) of the barrier layer 22 and so forth can be maintained better than when the entire surface is treatment by plasma or the like. As a result, leakage and so forth of the discharged microscopic upper layer droplet 27b in the receptacle hole 23 can be avoided, and the light emitting layer 27 can be reliably formed relative to the amount of this microscopic upper layer droplet 27b. This in turn allows the uniformity of shape between organic EL layers 30 to be further enhanced.

(4) With the above embodiment, the lower layer droplet 25D was formed by the microscopic lower layer droplet 25b discharged from the droplet discharge apparatus. Therefore, the desired amount of lyophilic microparticles 26 can be reliably contained in the lower layer droplet 25D (hole transport layer 25), and the organic EL layer 30 can be formed in a more uniform shape than with other liquid phase processes (such as spin coating).

The above embodiment may be modified as follows.

In the above embodiment, the lyophilic microparticles 26 were constituted by titanium oxide ($TiO_2$) particles, but are not limited to this, and may instead be silica ($SiO_2$) particles, zinc oxide (ZnO) particles, tin oxide ($SnO_2$) particles, strontium titanate ($SrTiO_3$) particles, tungsten oxide ($WO_3$) particles, bismuth oxide ($Bi_2O$) particles, niobium oxide (NbO or $Nb_2O_5$) particles, vanadium oxide ($VO_2$, $V_2O_3$, or $V_2O_5$) particles, iron oxide ($Fe_2O_3$) particles, or the like.

Alternatively, the lyophilic microparticles 26 may contain particles composed of a combination of at least one of silica ($SiO_2$), titanium oxide ($TiO_2$), zinc oxide (ZnO), tin oxide ($SnO_2$), strontium titanate ($SrTiO_3$), tungsten oxide ($WO_3$), bismuth oxide ($Bi_2O$), niobium oxide (NbO or $Nb_2O_5$), vanadium oxide ($VO_2$, $V_2O_3$, or $V_2O_5$), and iron oxide ($Fe_2O_3$).

With the above embodiment, the lyophilic property of the lyophilic microparticles 26 was brought out by irradiation with ultraviolet light, but the invention is not limited to this, and the lyophilic microparticles 26 can be constituted by lyophilic silica ($SiO_2$), so that the hole transport layer 25 is rendered lyophilic with respect to the upper layer droplet 27D without any irradiation with ultraviolet light. This eliminates the lyophilic treatment step (step S14)[2] of the hole transport layer 25, and increases the productivity of the organic EL display 10.

With the above embodiment, the hole transport layer 25 of the organic EL display 10 contained the lyophilic microparticles 26, but the invention is not limited to this, and may be constituted such that the hole transport layer 25 contains the lyophilic microparticles 26 when the light emitting layer 27 is formed in the course of manufacturing the organic EL display 10. Specifically, the lyophilic microparticles 26 need only exhibit the property of improving wettability when the upper layer droplet 27D is formed, and need not manifest their lyophilic property when the hole transport layer 25 is formed, or after the light emitting layer 27 has been formed.

With the above embodiment, the laminated pattern was embodied as two layers, namely, the hole transport layer 25 and the light emitting layer 27, but is not limited to this. The laminated pattern may form a multiphoton structure in which these two layers are repeatedly laminated, or a plurality of thin film layers may be laminated, for example.

With the above embodiment, the organic EL display 10 was embodied as a bottom emission type, but is not limited to this, and may involve a top emission type instead. Alternatively, the light emitting layer 27 may be constituted as a lower thin film layer, and the lyophilic microparticles 26 may be contained in this light emitting layer 27.

With the above embodiment, the hole transport layer formation material 25s and the light emitting layer formation material 27s were embodied as high-molecular weight organic materials, but are not limited to this, and conventional low-molecular weight materials may be used instead.

With the above embodiment, the organic EL layer 30 was constituted by the hole transport layer 25 and the light emitting layer 27, but the constitution may instead be such that an electron injection layer composed of laminated films of calcium and lithium fluoride, for example, is provided to the upper layer of this light emitting layer 27. Also, the electron injection layer here may be formed by droplets, and a surfactant contained in the light emitting layer 27.

With the above embodiment, the control element formation region 14 was equipped with the switching transistor T1 and the drive transistor T2, but is not limited to this, and the constitution may instead be such that a single transistor, or numerous transistors, or numerous capacitors are used, according to the desired element design.

With the above embodiment, the organic EL layer 30 was formed by an inkjet method, but the invention is not limited to this, and the method for forming the organic EL layer 30 may instead be, such that, for example, the lower layer droplets 25D or the upper layer droplets 27D are formed by a liquid applied by spin coating or another such method, and the organic EL layer 30 is formed by drying and solidifying this liquid.

With the above embodiment, the microscopic lower layer droplets 25b were discharged by the piezoelectric elements 39, but the invention is not limited to this, and a resistance heating element may be provided to the liquid supply chamber 37, for example, and the microscopic lower layer droplets 25b may be discharged by bursting the bubbles formed by the heating of this resistance heating element.

With the above embodiment, the laminated pattern was embodied as the organic EL layer 30, but is not limited to this, and may instead be color filters of various colors formed by discharging droplets on an underlying layer in which lyophilic microparticles are contained, and may also be any of various wiring patterns of the scanning lines Lx or the data lines Ly, for example.

With the above embodiment, the electro-optical device was embodied as the organic EL display 10, but is not limited to this, and may instead be a backlight mounted in a liquid crystal panel, for example, or may be a field effect type of display (FED, SED, etc.) that is equipped with a flat electron emission element, and that utilizes the ability of a fluorescent substance to emit light as a result of the electrons emitted from this element.

This application claims priority to Japanese Patent Application No. 2004-362542. The entire disclosure of Japanese Patent Application No. 2004-362542 is hereby incorporated herein by reference.

What is claimed is:
1. A patterned substrate, comprising
a laminated pattern having laminated patterns that are formed by drying droplets containing a pattern formation material,
wherein a lower layer pattern contains lyophilic microparticles that are lyophilic with respect to droplets that form an upper layer pattern.

2. The patterned substrate according to claim 1, wherein the lyophilic microparticles contain at least one of silica particles, titanium oxide particles, zinc oxide particles, tin oxide particles, strontium titanate particles, tungsten oxide particles, bismuth oxide particles, niobium oxide particles, vanadium oxide particles, and iron oxide particles.

3. The patterned substrate according to claim 1, wherein the lyophilic microparticles contain particles each composed of a combination of at least one of silica, titanium oxide, zinc oxide, tin oxide, strontium titanate, tungsten oxide, bismuth oxide, niobium oxide, vanadium oxide, and iron oxide.

4. The patterned substrate according to claim 1, wherein the lyophilic microparticles have an average diameter of 0.5 µm or less.

5. The patterned substrate according to claim 1, wherein the pattern formation material is a light emitting element formation material, and the laminated pattern is a light emitting element.

6. An electro-optical device, comprising:
an electrode; and
a light emitting element having thin film layers that are laminated over the electrode and formed by drying droplets containing a thin film layer formation material,
wherein a lower thin film layer contains lyophilic microparticles that are lyophilic with respect to droplets that form an upper thin film layer.

7. The electro-optical device according to claim 6, wherein
the lyophilic microparticles contain at least one of silica particles, titanium oxide particles, zinc oxide particles, tin oxide particles, strontium titanate particles, tungsten oxide particles, bismuth oxide particles, niobium oxide particles, vanadium oxide particles, and iron oxide particles.

8. The electro-optical device according to claim 6, wherein
the lyophilic microparticles contain particles each composed of a combination of at least one of silica, titanium oxide, zinc oxide, tin oxide, strontium titanate, tungsten oxide, bismuth oxide, niobium oxide, vanadium oxide, and iron oxide.

9. The electro-optical device according to claim 6, wherein
the lyophilic microparticles have an average diameter of 0.5 µm or less.

10. The electro-optical device according to claim 6, wherein
the light emitting element is an electroluminescence element having the laminated thin film layers between a transparent electrode and a back electrode.

11. The electro-optical device according to claim 10, wherein
the light emitting element is an organic electroluminescence element having the thin film layers composed of an organic material.

* * * * *